US006693350B2

(12) United States Patent
Teshima et al.

(10) Patent No.: US 6,693,350 B2
(45) Date of Patent: Feb. 17, 2004

(54) SEMICONDUCTOR DEVICE HAVING RADIATION STRUCTURE AND METHOD FOR MANUFACTURING SEMICONDUCTOR DEVICE HAVING RADIATION STRUCTURE

(75) Inventors: Takanori Teshima, Okazaki (JP); Yutaka Fukuda, Kariya (JP); Yoshimi Nakase, Anjo (JP); Kuniaki Mamitsu, Okazaki (JP); Tomoatsu Makino, Okazaki (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/321,365

(22) Filed: Dec. 18, 2002

(65) Prior Publication Data

US 2003/0132530 A1 Jul. 17, 2003

Related U.S. Application Data

(63) Continuation-in-part of application No. 09/717,227, filed on Nov. 22, 2000.

(30) Foreign Application Priority Data

Nov. 24, 1999 (JP) ........................................... 11-333119
Nov. 24, 1999 (JP) ........................................... 11-333124
Mar. 24, 2000 (JP) ........................................ 2000-088579
Mar. 30, 2000 (JP) ........................................ 2000-097911
Mar. 30, 2000 (JP) ........................................ 2000-097912
Oct. 4, 2000 (JP) ........................................ 2000-305228
Dec. 19, 2001 (JP) ........................................ 2001-385791

(51) Int. Cl.$^7$ ............................................... H01L 23/34

(52) U.S. Cl. ........................................ 257/712; 257/796

(58) Field of Search ................................. 257/718, 712, 257/723, 787, 796, 181

(56) References Cited

U.S. PATENT DOCUMENTS 4,141,030 A  2/1979  Eisele et al.
4,470,063 A  9/1984  Arakawa et al.

(List continued on next page.)

FOREIGN PATENT DOCUMENTS

EP  0450980  4/1991
EP  0660396  12/1993

(List continued on next page.)

OTHER PUBLICATIONS

Takamura, "Electronic Technology", pp. 56–59 (1999–5).
Johnson et al., "Silicon Precipitate Nodule–Induced Failures of MOSFETS", ISTFA '91 (Nov. 11–15, 1991), pp. 161–165.

(List continued on next page.)

*Primary Examiner*—Roy Potter
(74) *Attorney, Agent, or Firm*—Posz & Bethards, PLC

(57) ABSTRACT

A semiconductor device includes a first conductive member, a second conductive member, a semiconductor chip, which is located between the conductive members, a bonding member, which is located between the first conductive member and the semiconductor chip, another bonding member, which is located between the second conductive member and the semiconductor chip, a molding resin, which is located between the first and second conductive members to seal the semiconductor chip, and a bonding member anti-sticking means, which is located between the molding resin and a surface of one member selected from the group consisting of the semiconductor chip and the conductive members. The bonding member anti-sticking means prevents the bonding members from sticking to the surface in the manufacturing process. As a result, the otherwise insufficient connection due to the sticking between the molding resin and the surface is improved, and the semiconductor device becomes durable in electric performance.

25 Claims, 7 Drawing Sheets

U.S. PATENT DOCUMENTS

| | | |
|---|---|---|
| 4,538,170 A | 8/1985 | Yerman |
| 4,546,374 A | 10/1985 | Olsen et al. |
| 4,558,345 A | 12/1985 | Dwyer et al. |
| 4,646,129 A | 2/1987 | Yerman et al. |
| 4,827,082 A | 5/1989 | Horiuchi et al. |
| 4,984,061 A | 1/1991 | Matsumoto |
| 5,221,851 A | 6/1993 | Gobrecht et al. |
| 5,229,646 A | 7/1993 | Tsumura |
| 5,248,853 A | 9/1993 | Ishikawa et al. |
| 5,481,137 A | 1/1996 | Harada et al. |
| 5,641,997 A | 6/1997 | Ohta et al. |
| 5,708,299 A | 1/1998 | Teramae et al. |
| 5,726,466 A | 3/1998 | Nishitani |
| 5,789,820 A | 8/1998 | Yamashita |
| 5,801,445 A | 9/1998 | Ishihara et al. |
| 6,072,240 A | 6/2000 | Kimura et al. |
| 6,448,645 B1 | 9/2002 | Kimura |
| 2002/0158333 A1 | 10/2002 | Teshima |

FOREIGN PATENT DOCUMENTS

| | | |
|---|---|---|
| GB | 2146174 | 11/1985 |
| JP | 54-40569 | 3/1979 |
| JP | 54-95183 | 7/1979 |
| JP | 59-031042 | 2/1984 |
| JP | 59-38734 | 9/1984 |
| JP | 60-95947 | 5/1985 |
| JP | 60-137042 | 7/1985 |
| JP | 60-235430 | 11/1985 |
| JP | 61-166051 | 7/1986 |
| JP | 61-251043 | 11/1986 |
| JP | 61-265849 | 11/1986 |
| JP | 62-92349 | 4/1987 |
| JP | 62-141751 | 6/1987 |
| JP | 62-287649 | 12/1987 |
| JP | 63-096946 | 4/1988 |
| JP | 63-102326 | 5/1988 |
| JP | 01-228138 | 9/1989 |
| JP | 2-117157 | 5/1990 |
| JP | 3-20067 | 1/1991 |
| JP | 4-12555 | 1/1992 |
| JP | 4-27145 | 1/1992 |
| JP | 4-103150 | 4/1992 |
| JP | 4-249353 | 9/1992 |
| JP | 5-109919 | 4/1993 |
| JP | A-5-283562 | 10/1993 |
| JP | 6-291223 | 10/1994 |
| JP | A-6-349987 | 12/1994 |
| JP | A-7-45765 | 2/1995 |
| JP | 07-038013 | 2/1995 |
| JP | 07-240432 | 9/1995 |
| JP | 07-273276 | 10/1995 |
| JP | 8-45874 | 2/1996 |
| JP | 08-191145 | 7/1996 |
| JP | 9-148492 | 6/1997 |
| JP | A-11-186469 | 7/1999 |
| JP | 11-260979 | 9/1999 |
| JP | A-2000-31351 | 1/2000 |
| JP | 2000-91485 | 3/2000 |
| JP | A-2001-118961 | 4/2001 |
| WO | WO98/12748 | 3/1998 |

OTHER PUBLICATIONS

U.S. patent application Ser. No. 09/717,227, Mamitsu et al., filed Nov. 22, 2000.

U.S. patent application Ser. No. 10/201,556, Hirano et al., filed Jul. 24, 2002.

U.S. patent application Ser. No. 09/351,458, Nakase, filed Jul. 12, 1999.

U.S. patent application Ser. No. 09/435,840, Hirai, filed Nov. 8, 1999.

U.S. patent application Ser. No. 09/675,209, Suzuki, filed Sep. 29, 2000.

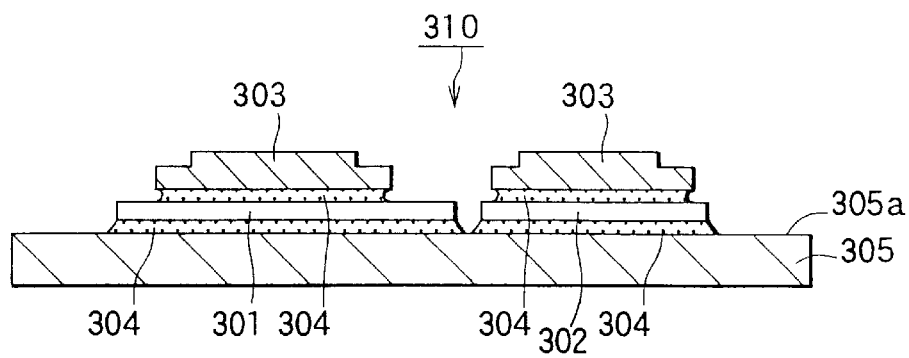
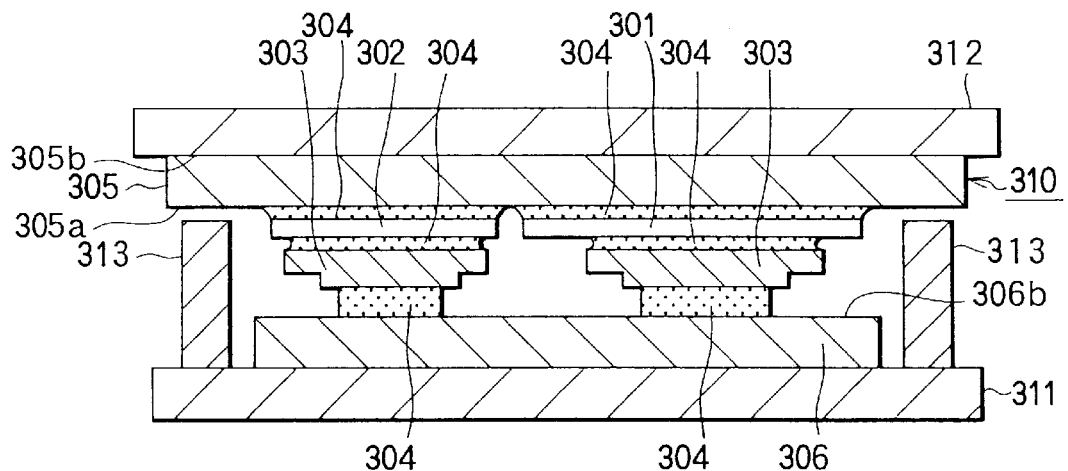
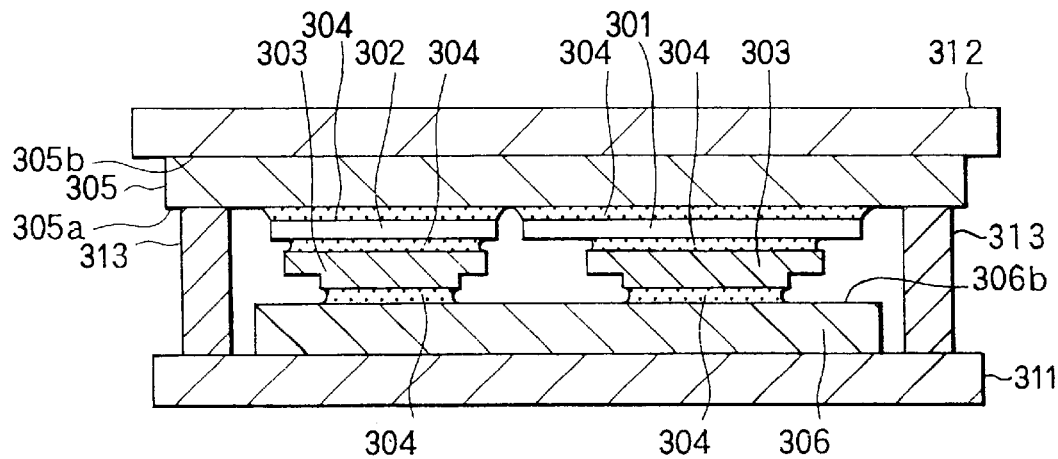

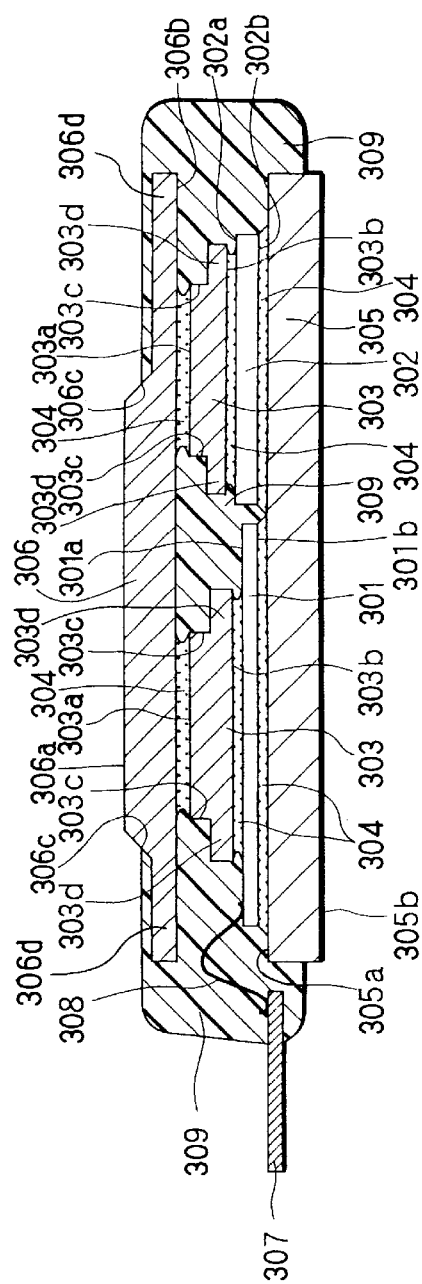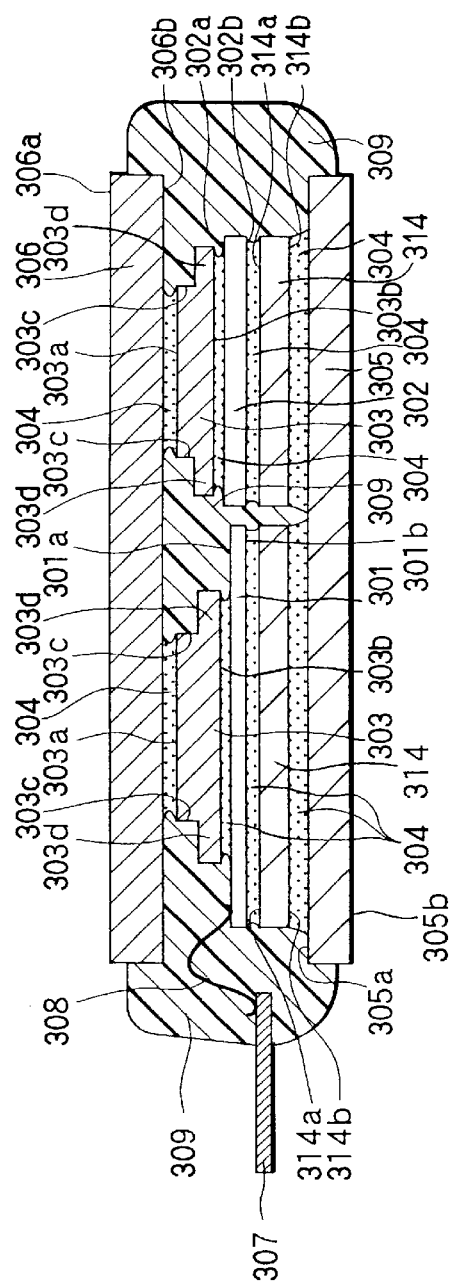

SEMICONDUCTOR DEVICE HAVING RADIATION STRUCTURE AND METHOD FOR MANUFACTURING SEMICONDUCTOR DEVICE HAVING RADIATION STRUCTURE

This is a continuation-in-part of application No. 09/717,227 filed on Nov. 22, 2000.

CROSS REFERENCE TO RELATED APPLICATION

This application is based on and incorporates herein by reference Japanese Patent Applications No. 2000-305228 filed on Oct. 4, 2000 and No. 2001-385791 filed on Dec. 19, 2001.

BACKGROUND OF THE INVENTION

The present invention relates to a semiconductor device, in which heat is released from two sides of a semiconductor chip accommodated therein.

As that kind of device, a semiconductor device shown in FIG. 1 is proposed. As shown in FIG. 1, semiconductor chips 101, 102 and couplers 103, 113 are located between a first heat radiation plate 106 and a second heat radiation plate 105. Each semiconductor chips 101, 102 and corresponding coupler 103, 113, each semiconductor chips 101, 102 and the second heat radiation plate 105, and each coupler 103, 113 and the first heat radiation plate 106 are respectively electrically connected to each other by solders 104.

Therefore, the two semiconductor chips 101, 102 are electrically connected in parallel using the couplers 103, 113 and the first and second heat radiation plates 106, 105. Mold resin 109 is also located between the first and second heat radiation plates 106, 105 and in contact with a coating resin film 110, which is located on surfaces of the semiconductor chips 101, 102, the couplers 103, 113, and the first and second heat radiation plates 106, 105.

The semiconductor chips 101, 102 are respectively, for example, an IGBT chip 101, which is an insulated gate bipolar transistor, and an FWD chip 102, which is a flywheel diode. Each semiconductor chip. 101, 102 has an element formation surface 101a, 102a, or a front surface 101a, 102a and a back surface 101b, 102b, which is opposite to the front surface 101a, 102a. Each coupler 103, 113 is located on corresponding front surface 101a, 102a.

The coupler 103 located on the front surface 101a of the IGBT chip 101 forms a space for wirebonding a bonding wire 108, which is described later, above the front surface 101a of the IGBT chip 101. The coupler 103 located on the front surface 102a of the FWD chip 102 adjusts the distance between the FWD chip 102 and the first heat radiation plate 106 such that the first heat radiation plate 106 becomes substantially parallel to the second heat radiation plate 105.

The second heat radiation plate 105 is electrically connected to the back surface 101b of the IGBT chip 101, which is a collector electrode, and the back surface 102b of the FWD chip 102, which is a cathode. The first heat radiation plate 106 is electrically connected to the front surface 101a of the IGBT chip 101, which is an emitter electrode, and the front surface 102a of the FWD chip 102, which is an anode.

The couplers 103, 113 and the first and second heat radiation plates 106, 105 release the heat that is generated by the semiconductor chips 101, 102 while functioning as electric wiring for the semiconductor chips 101, 102. Therefore, the solders 104 need to have a relatively high electric conductance and a relatively high thermal conductance.

Although not illustrated, a gate electrode is located at a predetermined position on the front surface 101a of the IGBT chip 101. The gate electrode is electrically connected to a control terminal 107 with the bonding wire 108. The semiconductor chips 101, 102, the couplers 103, 113, the first and second heat radiation plates 106, 105, the control terminal 307, and the bonding wire 108 are integrally molded with a molding resin used for forming the molding resin 109 such that a back surface 105b of the second heat radiation plate 105, a front surface 106b of the first heat radiation plate 106, and a portion of the control terminal 307 are exposed, as shown in FIG. 1.

Although not illustrated, cooling members, which cool the first and second heat radiation plates 106, 105, are located in contact with the back surface 105b of the second heat radiation plate 105 and the front surface 106a of the first heat radiation plate 106, so heat is efficiently released from the first and second heat radiation plates 106, 105.

In the semiconductor device shown in FIG. 1, the semiconductor chips 101, 102, the couplers 103, 113, and the heat radiation plates 106, 105 are respectively different in thermal expansion coefficient from the molding resin 109. Therefore, a relatively great stress is generated in the vicinity of the boundary between the molding resin 109 and each of the semiconductor chips 101, 102, the couplers 103, 113, and the heat radiation plates 106, 105 when the semiconductor device experiences thermal cycles. When the thermally generated stress overcomes the adhesion between the molding resin 109 and any of the semiconductor chips 101, 102, the couplers 103, 113, and the heat radiation plates 106, 105, the molding resin 109 peels off. The greater the difference in temperature of the thermal cycles, the smaller the number of the cycles that cause the peeling.

A stress is also generated in each solder 104 during the thermal cycles due to the difference in thermal expansion coefficient between the semiconductor chips 101, 102, the couplers 103, 113, and the heat radiation plates 106, 105. However, the stress in each solder 104 is suppressed by the molding resin 109 because the molding resin 109 restrains the thermal expansions of the semiconductor chips 101, 102, the couplers 103, 113, and the heat radiation plates 106, 105. Therefore, if the coating resin film 110 did not exist and the molding resin 109 peeled off any of the semiconductor chips 101, 102, the couplers 103, 113, and the heat radiation plates 106, 105, the stress in each solder 104 would increase and the solders 104 would deteriorate at an undesirably high rate. As a result, any solder 104 would crack, and the electric resistance of the solder 104 would increase.

The coating resin film 110 has a relatively high adhesion with the molding resin 109 and any of the semiconductor chips 101, 102, the couplers 103, 113, and the heat radiation plates 106, 105, so the molding resin 109 is prevented from peeling off during the thermal cycles.

Nevertheless, in the manufacturing process of the semiconductor device shown in FIG. 1, the solders 104 spread and adhere to any side surface of the semiconductor chips 101, 102 and the couplers 103, 113, as illustrated in FIG. 2. In that case, a portion of the solders 104, which is mechanically relatively weak, exists between the side surface and the coating resin film 110. If the semiconductor device having the portion of the solders 104 between the side surface and the coating resin film 110 experiences thermal cycles, the portion of the solders 104 peels off the side surface.

In other words, the molding resin 109 is disconnected from the side surface. In that case, as described above, the stress in that solder 104 increases and that solder 104 deteriorates at an undesirably high rate. In addition, in the case that two types of solders, which have a different melting point from each other, are used, the solders might be mixed with each other, and as a result, eutectic solder having a melting point much lower than those of the two types of solders might be formed to fuse at the temperature for the molding using the molding resin 109.

SUMMARY OF THE INVENTION

The present invention has been made in view of the above aspects with an object to provide a semiconductor device in which a molding resin is prevented from peeling off to assure the durablity in its electric performance.

In the present invention, a semiconductor device includes a first conductive member, a second conductive member, a semiconductor chip, which is located between the conductive members, a bonding member, which is located between the first conductive member and the semiconductor chip, and another bonding member, which is located between the second conductive member and the semiconductor chip.

The semiconductor device further includes a molding resin, which is located between the first and second conductive members to seal the semiconductor chip, and a bonding member anti-sticking means, which is located between the molding resin and a surface of one member selected from the group consisting of the semiconductor chip and the conductive members. The bonding member anti-sticking means prevents the bonding members from sticking to the surface in the manufacturing process. As a result, the otherwise insufficient connection due to the sticking between the molding resin and the surface is improved, and the semiconductor device becomes more durable in its electric performance.

BRIEF DESCRIPTION OF THE DRAWINGS

The above and other objects, features and advantages of the present invention will become more apparent from the following detailed description made with reference to the accompanying drawings. In the drawings:

FIGS. 7A to 7C are cross-sectional views showing the steps for manufacturing the semiconductor device of FIG. 6;

FIG. 8 is a schematic cross-sectional view of a semiconductor device according to a third embodiment;

FIG. 9 is a schematic cross-sectional view of a semiconductor device according to a fourth embodiment.

DETAILED DESCRIPTION OF THE PREFERRED EMBODIMENTS

The present invention will be described in detail with reference to various embodiments.

First Embodiment

Figure 3:
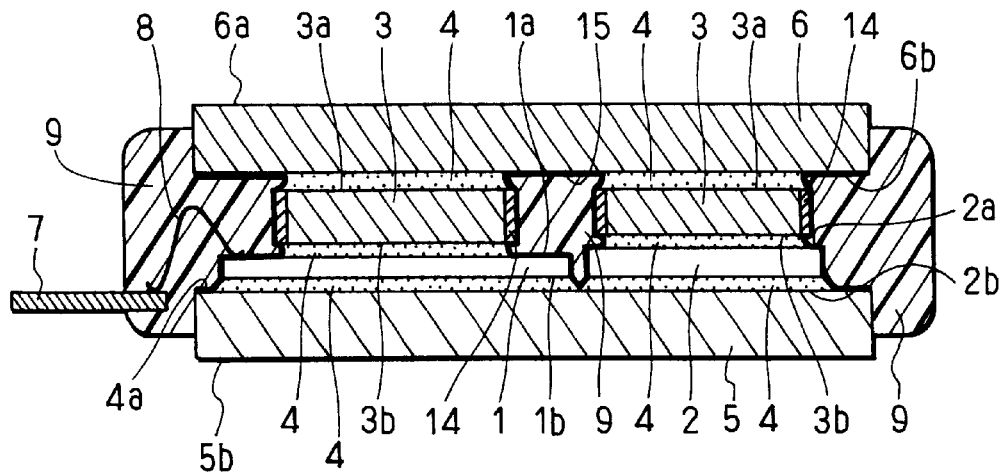
FIG. 3 is a schematic cross-sectional view of a semiconductor device according to a first embodiment of the present invention.

A semiconductor device shown in FIG. 3 includes two semiconductor chips 1, 2, a first conductive member 3, 6, which includes two couplers 3 and a first heat radiation plate 6, and a second conductive member 5, or a second heat radiation plate 5. The semiconductor chips 1, 2 are electrically connected in parallel using the couplers 3, the first heat radiation plate 6, and the second heat radiation plate 5. The semiconductor chips 1, 2 and the couplers 3 are located between the first and second heat radiation plates 6, 5. A bonding member anti-sticking means 14, or a first coating resin film 14, is located on each side surface of the couplers 3, as illustrated in FIG. 3. A second coating resin film 15 is located on surfaces of the semiconductor chips 1, 2, the first and second heat radiation plates 6, 5, and the first coating resin film 14. Mold resin 9 is located between the first and second heat radiation plates 6, 5 and in contact with the second coating resin film 15.

The semiconductor chips 1, 2 are respectively an IGBT chip 1, which is an insulated gate bipolar transistor, and an FWD chip 2, which is a fly-wheel diode. Each semiconductor chip 1, 2 is made of substantially silicon and has a thickness of about 0.5 mm. Each semiconductor chip 1, 2, has an element formation surface 1a, 2a, or a front surface 1a, 2a, in which a region making up a transistor is located, and a back surface 1b, 2b, which is opposite to the front surface 1a, 2a. Each coupler 3 is located on corresponding front surface 1a, 2a. Although not illustrated, an emitter electrode and a gate electrode are located on the front surface 1a of the IGBT chip 1, and a collector electrode is located on the back surface 1b of the IGBT chip 1.

Each front surface 1a, 2a of the semiconductor chips 1, 2 is bonded to corresponding back surface 3b of the couplers 3 with bonding members 4, or solders 4, which have a relatively high electric conductance and a relatively high thermal conductance. The first coating resin film 14, which is located on the side surfaces of the couplers 3, is made of a resin such as a polyamide resin, a polyimide resin, and an amide resin.

The coupler 3 located on the front surface 1a of the IGBT chip 1 forms a space for wirebonding a bonding wire 8, which is described later, above the front surface 1a of the IGBT chip 1. The coupler 3 located on the front surface 2a of the FWD chip 2 adjusts the distance between the FWD chip 2 and the first heat radiation plate 6 such that the first heat radiation plate 6 becomes substantially parallel to the second heat radiation plate 5.

The area of the coupler 3 at which the coupler 3 is bonded to the IGBT chip 1 is substantially equal to the dimension of the emitter electrode of the IGBT chip 1. Therefore, the coupler 3 is preferably in contact with the emitter electrode with the maximum area while being prevented from undesirably contacting an area outside the emitter electrode. If the IGBT chip 1 contacted the area outside the emitter electrode, the area outside the emitter electrode would undesirably become equipotential with the emitter electrode.

The back surfaces 1b, 2b of the semiconductor chips 1, 2 are bonded and electrically connected to a front surface 5a of the second heat radiation plate 5 with solders 4. Front surface 3a, which is opposite to the back surfaces 3b of the couplers 3, is boned and electrically connected to a back surface 6b of the first heat radiation plate 6 with solders 4. The coupler 3 and the first and second heat radiation plates 6, 5 are made of a metal having electrical conductivity. Specifically, the couplers 3 are made of copper, and the first and second heat radiation plates 6, 5 are made of copper alloy.

Although not illustrated, a gate electrode is located at a predetermined position on the front surface 1a of the IGBT chip 1. The gate electrode is electrically connected to a control terminal 7 with the bonding wire 8. The semiconductor chips 1, 2, the couplers 3, and the first and second heat radiation plates 6, 5, the control terminal 7, and the bonding wire 8 are molded en bloc with the molding resin 9 such that a back surface 5b of the second heat radiation plate 5, a front surface 6a of the first heat radiation plate 6, and a portion of the control terminal 7 are exposed, as shown in FIG. 3. For example, an epoxy based resin can be used as the molding resin 9. Although not illustrated, a pair of molds is used for the molding.

The second coating resin film 15 improves the adhesion between the molding resin 9 and each semiconductor chip 1, 2 and the adhesion between the molding resin 9 and each of the first and second heat radiation plates 6, 5. The second coating resin film 15 is made of a resin such as a polyamide resin, a polyimide resin, and an amide resin.

In the semiconductor device shown in FIG. 3, the heat generated by the semiconductor chips 1, 2 is transmitted to the couplers 3 and to the first and second heat radiation plates 6, 5 through the solders 4, and the heat is released outward from the back surface 5b of the second heat radiation plate 5 and the front surface 6a of the first heat radiation plate 6. Although not illustrated, cooling members, which cool the first and second heat radiation plates 6, 5, are located in contact with the back surface 5b of the second heat radiation plate 5 and the front surface 6a of the first heat radiation plate 6, so heat is efficiently released from the first and second heat radiation plates 6, 5.

In the manufacturing process of the semiconductor device shown in FIG. 3, the first coating resin film 14 is formed to cover the side surfaces of the couplers 3. Therefore, even if any solder 4 spreads along the side surfaces of the couplers 3 when the semiconductor chips 1, 2, the couplers 3, and the heat radiation plates 6, 5 are integrated with the solders 4, no solders 4 stick to any side surface. In addition, substantially no solders 4 stick to the first coating resin film 14 because the solders 4 dewet the first coating resin film 14.

Therefore, the side surfaces of the couplers 3 and the molding resin 9 are firmly connected by the first and second coating resin films 14, 15. Thus, even when the semiconductor device of FIG. 3 experiences thermal cycles, the molding resin 9 is prevented from peeling off to be disconnected from the couplers 3. Accordingly, the stress in each solder 4 is prevented from increasing, and each solder 4 is prevented from deteriorating. In addition, even if two types of solders, which have a different melting point from each other, are used, the solders are not mixed with each other. Therefore, eutectic solder having a melting point much lower than those of the two types of solders is not formed to fuse at the temperature for the molding using the molding resin 9.

The semiconductor device of FIG. 3 is manufactured as follows. First and second heat radiation plates 6, 5 are stamped out of plates made of copper alloy and so on. A resin such as a polyamide resin, a polyimide resin, and an amide resin is coated on surfaces of copper plates to form couplers 3 having a first coating resin film 14.

Figure 4A:
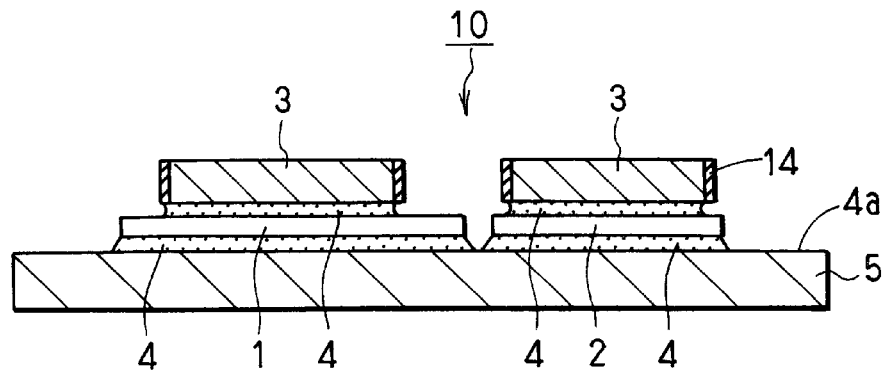
FIGS. 4A to 4C are cross-sectional views showing the steps for manufacturing the semiconductor device of FIG. 3.

Then, as shown in FIG. 4A, an IGBT chip 1 and an FWD chip 2 are bonded to a front surface 5a of the second conductive member 5 using a solder 4. Next, each coupler 3 is bonded to corresponding front surface 1a, 2a of the semiconductor chip 1, 2 using a solder 4 to form a work 10, as shown in FIG. 4A. Then, although not illustrated, the IGBT chip 1 is connected to a control terminal 7 by a bonding wire 8.

Figure 4B:
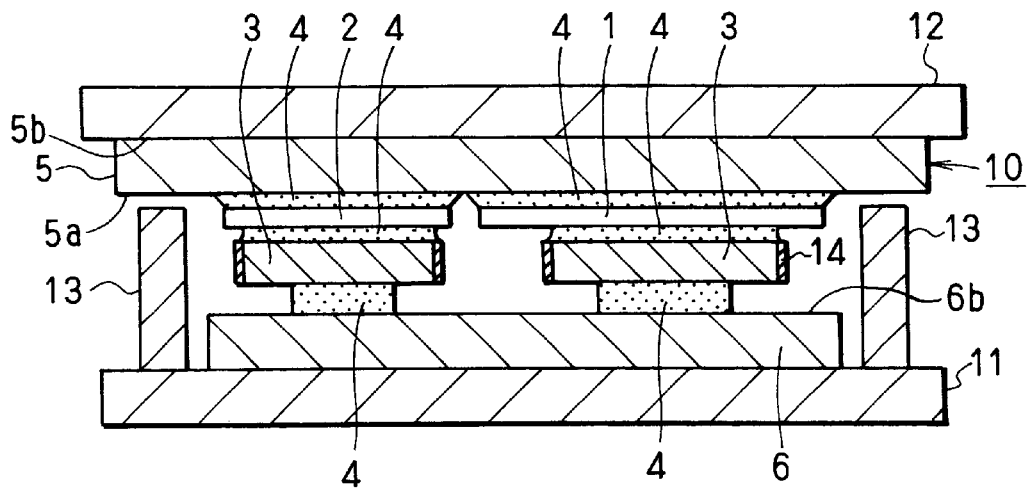

Next, as shown in FIG. 4B, the first heat radiation plate 6 is mounted on a jig 11 such that a back surface 6b of the first heat radiation plate 6 faces upward, and solders 4 are placed on predetermined positions of the back surface 6b. Then, the work 10 is turned over. The work 10 is aligned with and placed on the first heat radiation plate 6.

Figure 4C:
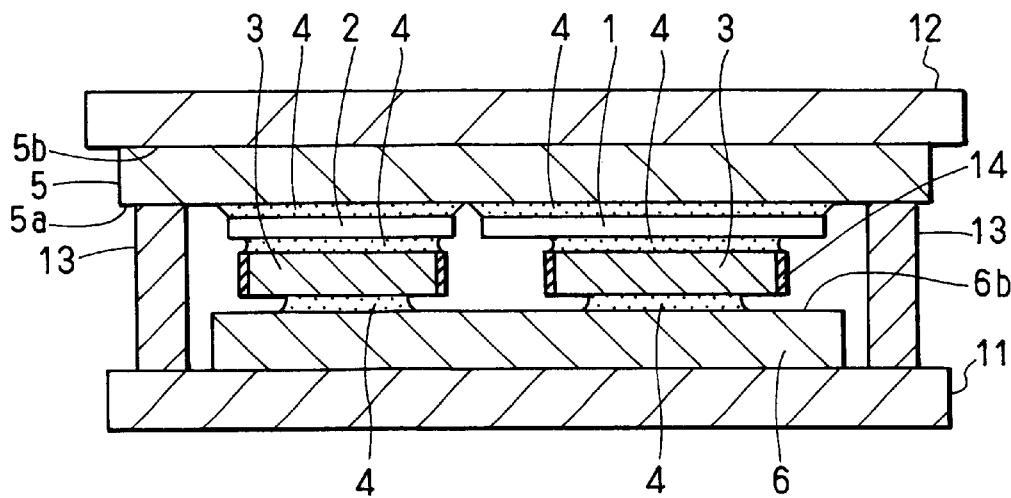

Then, a plate-shaped weight 12 is placed on a back surface 5b of the second heat radiation plate 5. Spacers 13 having a predetermined length are placed between the jig 11 and the second heat radiation plate 5 for adjusting the distance between the first and second heat radiation plates 6, 5 to a predetermined value, as shown in FIG. 4C. The body of the FIG. 4B is placed en bloc in a heating furnace to permit the solders 4 to reflow. During the reflowing, the work 10 is pressed by the weight 12, so the solders 4 are thinned. As a result, as shown in FIG. 4C, the distance between the back surface 6b of the first heat radiation plate 6 and the front surface 5a of the second heat radiation plate 5 becomes equal to the length of the spacers 13. The degree of parallelization between the first and second heat radiation plates 6, 5 is substantially determined by the spacers 13.

In the manufacturing process of FIGS. 4A to 4C, the semiconductor chips 1, 2 and the second heat radiation plate 5 are bonded. Next, the couplers 3 and the semiconductor chips 1, 2 are bonded. Finally, the first heat radiation plate 6 and the couplers 3 are bonded. However, the order of the above bonding steps may be changed. For example, the following order is possible. The couplers 3 and the first heat radiation plate 6 are bonded with solders 4. Then, the couplers 3, the semiconductor chips 1, 2, and the second heat radiation plate 5 are bonded together with solders 4 at the same time. Alternatively, the semiconductor chips 1, 2, the couplers 3, and the first and second heat radiation plates 6, 5 can be stacked and bonded together with solders 4 at the same time.

Subsequently, a resin such as a polyamide resin, a polyimide resin, and an amide resin is coated on surfaces of the semiconductor chips 1, 2, the first and second heat radiation plates 6, 5, and the first coating resin film 14 for forming the coating resin film 15. The resin may be coated by immersing the soldered body shown in FIG. 4C in the resin solution. Alternatively, the resin may be coated by drizzling or spraying the resin from a dispense nozzle. It is preferred that the control terminal 7 and the bonding wire 8 be coated with the resin. Finally, the semiconductor chips 1, 2, the couplers 3, and the first and second heat radiation plates 6, 5, the control terminal 7, and the bonding wire 8 are molded en bloc with molding resin 9 to complete a semiconductor device of FIG. 3.

Second Embodiment

Figure 5:
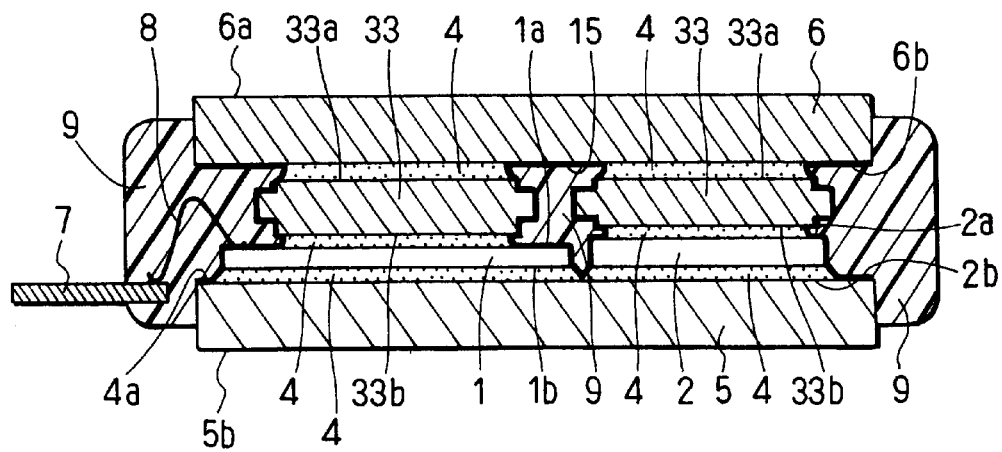
FIG. 5 is a cross-sectional view of a semiconductor device according to a second embodiment.

A semiconductor device shown in FIG. 5 includes two semiconductor chips 1, 2, a first conductive member 33, 6, which includes two couplers 33 and a first heat radiation plate 6, and a second conductive member 5, or a second heat radiation plate 5. The semiconductor device shown in FIG. 5 does not include the same bonding member anti-sticking means, or the first coating resin film 14, as the one used in the semiconductor device shown in FIG. 3. Instead, in the semiconductor device shown in FIG. 5, a flange is located at the side surface of each coupler 33, at which each coupler 33 is connected to a molding resin 9 by a second coating resin film 15, as a bonding member anti-sticking means. In that aspect, the semiconductor device shown in FIG. 5 is different from the semiconductor device shown in FIG. 3.

Therefore, even if any solder 4 spreads along the side surfaces of the couplers 33 when the semiconductor chips 1, 2, the couplers 33, and the first heat radiation plate 6 are bonded with solders 4, no solders 4 stick to, at least, the top surface of each flange. That is, the top surface and the molding resin 9 are firmly connected by the second coating resin film 15. Thus, even when the semiconductor device of FIG. 5 experiences thermal cycles, the molding resin 9 is prevented from peeling off to be disconnected from the top surface. Accordingly, the stress in each solder 4 is prevented from increasing, and each solder 4 is prevented from deteriorating.

Third Embodiment

Figure 6:
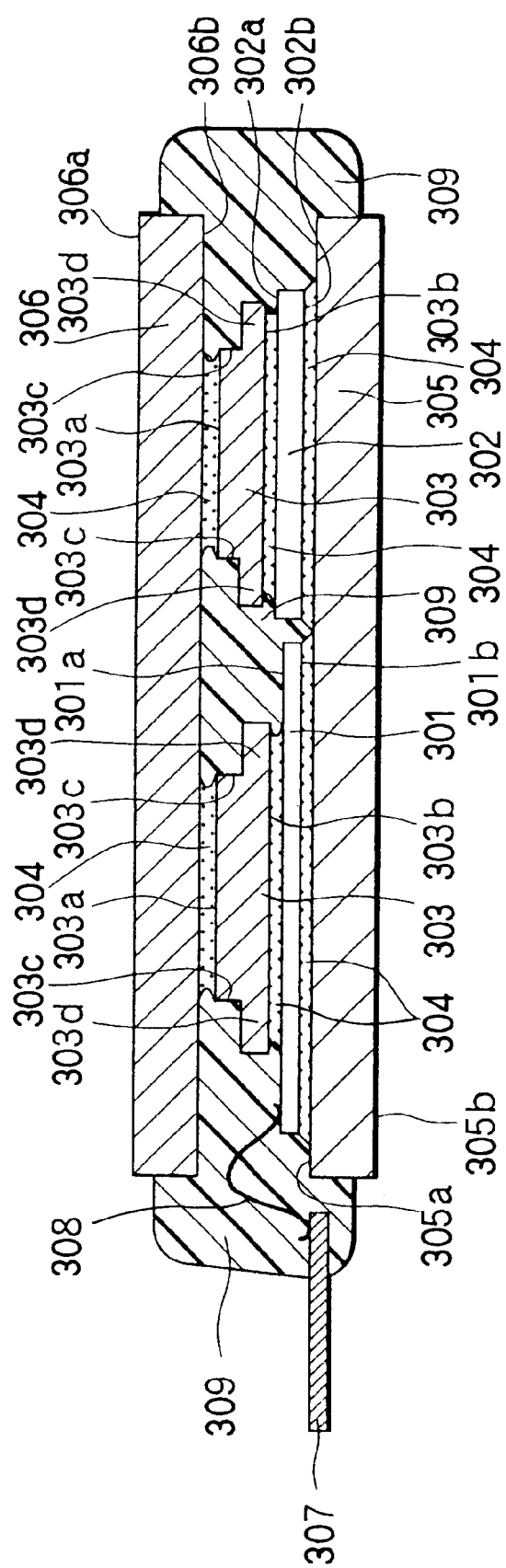
FIG. 6 is a schematic cross-sectional view of a semiconductor device according to a third embodiment.

A semiconductor device shown in FIG. 6 includes two semiconductor chips 301, 302, a first conductive member 303, 306, which includes two plate-like couplers 303 and a first heat radiation plate 306, and a second conductive member 305, or a second heat radiation plate 305. The semiconductor chips 301, 302 are respectively, an IGBT chip 301, which is an insulated gate bipolar transistor, and an FWD chip 302, which is a fly-wheel diode. The semiconductor chips 301, 302 are made of substantially silicon and have a thickness of about 0.5 mm.

Each semiconductor chip 301, 302 has an element formation surface 301a, 302a, or a front surface 301a, 302a, in which a region making up a transistor is located, and a back surface 301b, 302b, which is opposite to the front surface 301a, 302a. Each coupler 303 is located on corresponding front surface 301a, 302a. Although not illustrated, an emitter electrode is located on the front surface 301a of the IGBT chip 301, and a collector electrode is located on the back surface 301b of the IGBT chip 301.

Each front surface 301a, 302a of the semiconductor chips 301, 302 is bonded to corresponding back surface 303b of the couplers 303 with a first bonding member 304, or a first solder 304, that has a relatively high electric conductance and a relatively high thermal conductance. The area of the coupler 303 at which the coupler 303 is bonded to the IGBT chip 301 is substantially equal to the dimension of the emitter electrode of the IGBT chip 301.

Therefore, the coupler 303 is preferably in contact with the emitter electrode with the maximum area while being prevented from undesirably contacting an area outside the emitter electrode, where elements such as a guard ring are located. If the IGBT chip 301 contacted the area outside the emitter electrode, the area outside the emitter electrode would undesirably become equipotential with the emitter electrode.

The back surfaces 301b, 302b of the semiconductor chips 301, 302 are electrically connected to a front surface 305a of the second heat radiation plate 305 with second bonding members 304, or second solders 304. Front surfaces 301a, 303a, which are opposite to the back surfaces 301b 303b of the couplers 303, are electrically connected to a back surface 306a of the first heat radiation plate 306 with third bonding members 304, or third solders 304. The couplers 303 and the first and second heat radiation plates 306, 305 are made of a metal having electrical conductivity. Specifically, the couplers 303 are made of copper, and the first and second heat radiation plates 306, 305 are made of copper alloy.

A step 303c, which is defined by a flange 303d, is located around each coupler 303, as shown in FIG. 6. Therefore, the front surface 303a of each coupler 303, at which each coupler 303 is connected to the first heat radiation plate 306, is smaller than the back surface of each coupler 303, at which each coupler 303 is connected to corresponding semiconductor chip 301, 302.

Although not illustrated, plated Ni layers are located on the front and back surfaces of each coupler 303 for improving the wettability of the first and third solders 304 to the surfaces. An oxide layer is located on the side surface of each coupler 303 and a surface of each flange 303d. Each radiation plate 306, 305 has a thickness of about 1 mm. Each coupler 303 has a thickness of 1 mm, and the flange 303d has a thickness of about 0.4 mm.

Although not illustrated, a land is located on the front surface 301a of the IGBT chip 301, and is electrically connected to a control terminal 307 of a lead frame with a bonding wire 308. The semiconductor chips 301, 302, the couplers 303, the flanges 303d, the second heat radiation plate 305, the first heat radiation plate 306, and the control terminal 307 are molded en bloc with the molding resin 309 such that a back surface 305b of the second heat radiation plate 305, a front surface 6a of the first heat radiation plate 6, and a portion of the control terminal 7 are exposed, as shown in FIG. 6. For example, an epoxy based resin can be used as the molding resin 309.

In the semiconductor device shown in FIG. 6, the heat generated by the semiconductor chips 301, 302 is transferred to the couplers 303 and to the first and second heat radiation plates 306, 305 through the solder 304, and the heat is released outward from the back surface 305b of the second heat radiation plate 305 and the front surface 306a of the first heat radiation plate 306. Although not illustrated, cooling members, which cool the first and second heat radiation plates 306, 305, are located in contact with the back surface 305b of the second heat radiation plate 305 and the front surface 306a of the first heat radiation plate 306, so heat is efficiently released from the first and second heat radiation plates 306, 305.

The couplers 303 and the first and second radiation plates 306, 305 form electric current paths for the semiconductor chips 301, 302. That is, the electrical communication with the collector electrode of the IGBT chip 301 is permitted through the second heat radiation plate 305, while the electrical communication with the emitter electrode of the IGBT chip 301 is permitted through the first radiation plate 306 and corresponding coupler 303.

In the semiconductor device of FIG. 6, the flanges 303d are less rigid than the couplers 303. Therefore, the flanges 303d can conform to the deformation of the resin 309 that is connected to the flanges 303d to decrease the stress thermally generated at the boundary between each of the semiconductor chips 301, 302 and corresponding coupler 303 when the semiconductor device experiences thermal cycles.

Furthermore, the front surface 303a of each coupler 303 is smaller than the back surface of each coupler 303. Because the bonding strength decreases as the bonding areas of each coupler 303 for the heat radiation plates 305, 306 decreases, the third solder 304, which is located between each coupler 303 and the first heat radiation plate 306, cracks more readily than the first solder 304, which is located between each coupler 303 and corresponding semiconductor chip 301, 302, when the semiconductor device of FIG. 6 experiences thermal cycles.

If the third solder 304 cracks, the stress thermally generated in the third solder 304 relaxes. At the same time, the stress thermally generated in the first solder 304 relaxes. Therefore, at least, the first solder 304 can be prevented from cracking. In addition, the couplers 303 and the first heat radiation plate 306 include copper as a main component, so the couplers 303 and the first heat radiation plate 306 are similar to each other in the deformation caused by the thermal cycle.

Therefore, even if the third solder 304 cracks, the cracking of the third solder 304 proceeds relatively slowly. In addition, the current path between each coupler 303 and the first heat radiation plate 306 is formed by the entire area at which each coupler 303 and the first heat radiation plate 306 are connected. Therefore, even if the cracking proceeds, the electric resistance at the area does not steeply increase locally or as a whole.

The oxide layer is located on the side surface of each coupler 303 and the surface of each flange 303d. Therefore, the adhesion between the molding resin 309 and each coupler 303 and the adhesion between the molding resin 309 and the surface of each flange 303d is relatively high. As a result, the molding resin 309 conforms to the deformation of the coupler 303, which is caused by the thermal cycle, without peeling off, and the stress thermally generated in the solders 304 decreases. Incidentally, the adhesion between copper alloy and the molding resin 309 more increases by plating nickel on the surface of the copper alloy. Therefore, each surface of the first and second radiation plates 306, 305 is plated with nickel instead of being oxidized.

As shown in FIG. 6, the step 303c helps to increase the distance from the surface of the semiconductor device to the first solder 304 along the interface between the first heat radiation plate 306 and the molding resin 309, the interface between each coupler 303 and the molding resin 309, and the inter face between each flange 303d and the molding resin 309. Therefore, the step 303c helps to prolong the time until a peeling of the molding resin 309 that is generated at the surface of the semiconductor device reaches the first solder 304 along the interfaces.

Figure 1:
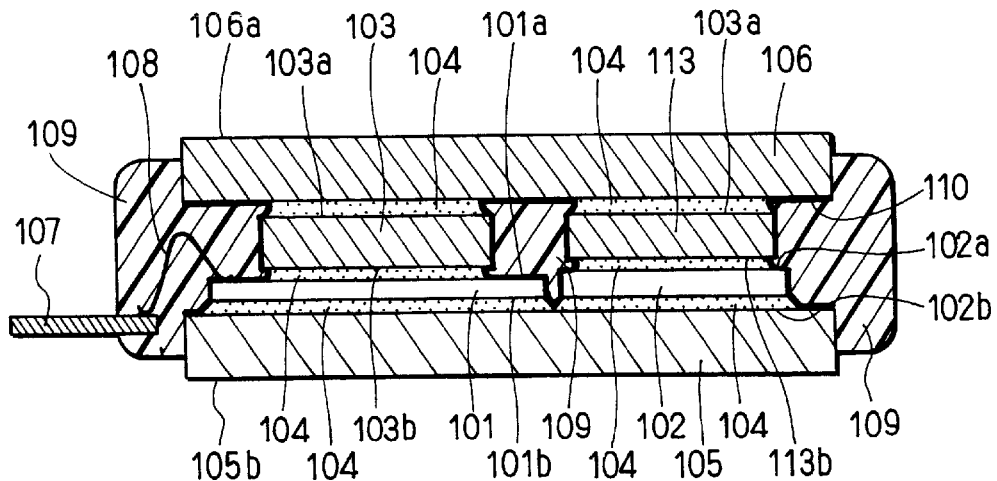
FIG. 1 is a schematic cross-sectional view of a proposed semiconductor device.
Figure 2:
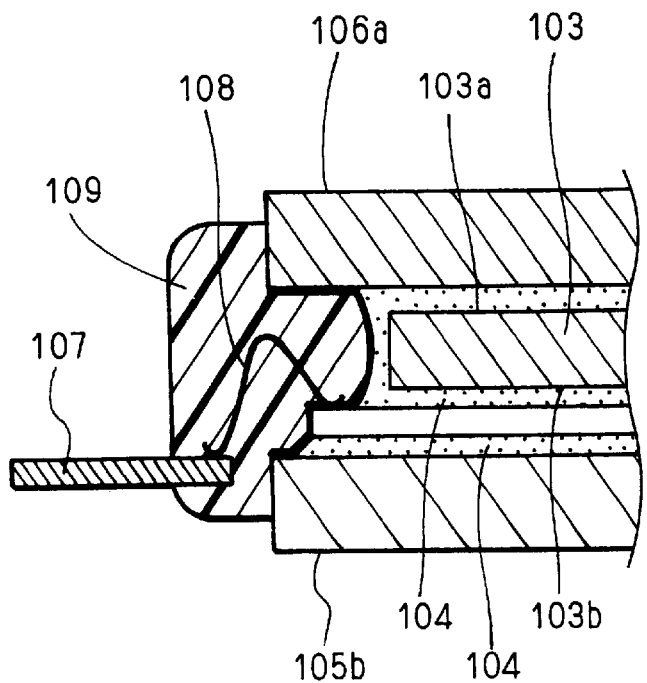
FIG. 2 is a partially enlarged view of the semiconductor device of FIG. 1.

The semiconductor device of FIG. 6 underwent a thermal cycle test. In the thermal cycle test, the semiconductor device was alternately exposed to a temperature of −40° C. for 60 minutes and a temperature of 125° C. for 60 minutes. Then, the resistance between the first heat radiation plate 306 and the control terminal 307 was measured, and the resistance change rate was calculated using the initial resistance value as a reference. It was confirmed that the resistance change rate did not increase steeply until 200 cycles and the semiconductor device of FIG. 6 is more durable than the proposed device of FIG. 1.

The semiconductor device of FIG. 6 is manufactured as follows. A pair of metal plates is stamped out of a board made of copper alloy and so on. Then, the entire surface of each plate is plated with nickel to complete a second heat radiation plate 305 and a first heat radiation plate 306.

A copper board for forming the couplers 303 is plated with nickel at its front and back surfaces. After that, a pair of copper plates is stamped out of the copper board. Then, each copper plate is pressed to form a flange 303d, which defines a step 303c, and a coupler 303. Each coupler 303 included nickel layers only at front and back surfaces 303a, 303b. No nickel layer is located on the side surface of each coupler 303 or the top surface of each flange 303d, which is exposed by the stamping. No nickel layer is located on the surface of the step 303c because the plated nickel layer peels off from the surface when the step 303c is formed by the pressing.

As shown in FIG. 7A, the semiconductor chips 301, 302, which are an IGBT chip 301 and an FWD chip 302, are bonded to a back surface 305a of the second heat radiation plate 305 with second solders 304. Next, the couplers 303 are bonded to the semiconductor chips 301, 302 with first solders 304 to form a work 310, as shown in FIG. 7A. The first and second solders 304 have a relatively high melting point. For example, a high melting point solder, which includes 10 weight % of tin (Sn) and 90 weight % of lead (Pb) and has a melting point of 320° C., can be used for the first and second solders 304.

Next, as shown in FIG. 7B, the first heat radiation plate 306 is mounted on a jig 311 such that a back surface 306b of the first heat radiation plate 306 faces upward, and third solders 304 are placed on predetermined positions of the back surface 306b. Then, the work 310 is turned over. The work 10 is aligned with and placed on the first heat radiation plate 6. The third solders 304 have a melting point lower than that of the high melting point solder. A low melting point solder, which includes tin (Sn) more than 90 weight % and has a melting point of 240° C., can be used for the third solders 304.

Then, a plate-shaped weight 312 is placed on the back surface 305b of the second heat radiation plate 305. Spacers 313 having a predetermined length are placed between the jig 311 and the second heat radiation plate 305 for adjusting the distance between the first and second heat radiation plates 306, 305 to a predetermined value, as shown in FIG. 7C. The body of the FIG. 7B is placed en bloc in a heating furnace to permit the third solders 304 to reflow. During the reflowing, the work 310 is pressed by the weight 312, so the third solders 304 are thinned. As a result, as shown in FIG. 7C, the distance between the back surface 306b of the first heat radiation plate 306 and the front surface 305a of the second heat radiation plate 305 becomes equal to the length of the spacers 313. The degree of parallelization between the first and second heat radiation plates 306, 305 is substantially determined by the spacers. 313.

The third solder 304 includes the low melting point solder, and the first and second solders 304 include the high melting point solder. Therefore, when the couplers 303 are bonded to the first heat radiation plate 306, the first and second solders 304 do not melt. Therefore, the positional relation between each coupler 303 and corresponding semiconductor chip 301, 302 remains unchanged. Incidentally, when the melting point of the first and second solders 304 is 320° C. and that of the third solder 304 is 240° C., the reflowing temperature is preferably 250° C.

After that, although not illustrated, the IGBT chip 301 is electrically connected to a control terminal 307 by a bonding wire 308. Finally, the semiconductor chips 301, 302, the couplers 303 and the first and second heat radiation plates 306, 305, the control terminal 307, and the bonding wire 308 are molded en bloc with molding resin 309 to complete a semiconductor device of FIG. 6. A molding resin having a temperature of about 180° C. is injected for the molding, so an oxide layer of the couplers 303 is formed during the molding.

The nickel plating for forming the couplers 303 could be done after corresponding copper plates are formed from a copper board without plating the copper board. In that case, the copper plates would be immersed in a plating bath to form a nickel layer on the copper plates. As a result, the entire surface of each copper plate would be plated. In that case, the first and second solders 304 could easily wet and spread to the side surface of each coupler 303, which needs to be connected to the molding resin 309.

In addition, the thickness of each coupler 303 is as thin as about 1 mm, so the third solders 304, which has a lower melting point, and the first solders 304, which has a higher melting point, are separated with a small distance of 1 mm from each other. Therefore, if the entire surface of each copper plate would be plated, the first and third solders 304 might be mixed with each other. In that case., eutectic solder having a melting point much lower than those of the third solder might be formed to fuse at the temperature for the molding using the molding resin 309, which is, for example, 180° C.

However, in the semiconductor device of FIG. 6, no nickel layer is located on the side surface of each coupler 303. Instead, the oxide layer, which is dewetted by the solders 304, is located on the side surface to separate the third solders 304 and the first solders 304. Therefore, neither the third solders 304 nor the first solders 304 spreads to the side surface of each coupler 303 and mix with each other.

Fourth Embodiment

As shown in FIG. 8, a semiconductor device according to the fourth embodiment includes a first heat radiation plate 306 that differs in shape from the first heat radiation plate 306 of the semiconductor device in FIG. 6. In other aspects, the two semiconductor devices are substantially the same.

The first heat radiation plate 306 in FIG. 8 includes a step 306c defined by a flange portion 306d on a front surface 306a, at the side of which the first heat radiation plate 306 is exposed. As shown in FIG. 8, the flange portion 306d is covered with a molding resin 309. Therefore, the step 306c further helps to increase the distance from the surface of the semiconductor device to the first solder 304 along the interface between the first heat radiation plate 306 and the molding resin 309, the interface between each coupler 303 and the molding resin 309, and the interface between each flange 303d and the molding resin 309. Therefore, the step 306c further helps to prolong the time until a peeling of the molding resin 309 that is generated at the surface of the semiconductor device reaches the first solder 304 along the interfaces. As a result, the first solder 304 is further prevented from cracking.

Incidentally, the distance increases as the area covered with the molding resin 309 on the front surface 306a of the first heat radiation plate 306 increases. However, as the covered area increases, the exposed area of the front surface 306a, or the heat radiation capability of the first heat radiation plate 306, decreases. Therefore, the first heat radiation plate 306 needs to be covered with the molding resin 309 taking the heat radiation capability of the first heat radiation plate 306 into consideration.

Fifth Embodiment

As shown in FIG. 9, a semiconductor device according to the fifth embodiment includes two additional couplers 314. In that aspect, the semiconductor device of FIG. 9 differs from the semiconductor device of FIG. 6. Therefore, the semiconductor device of FIG. 9 has the effect described before in addition to the same effects as the semiconductor device of FIG. 6.

Each additional coupler 314 is located between each semiconductor chip 301, 302 and a second heat radiation plate 305. As shown in FIG. 9, each additional coupler 314 has a front surface 314a and a back surface 314b, which is opposite to the front surface 314a, and each semiconductor chip 301, 302 has a front surface 301a and a back surface 301b, which is opposite to the front surface 301a. Each front surface 314a of the additional couplers 314 has approximately the same dimensions as corresponding back surface 301b, 302b of the semiconductor chips 301, 302.

Each front surface 314a of the additional couplers 314 is bonded to corresponding back surface 301b, 302b of the semiconductor chips 301, 302 with a solder 304. Each back surface 314b of the additional couplers 314 is bonded to a front surface 305a of the second heat radiation plate 305 with another solder 304.

The dimensions of the second heat radiation plate 305 are usually large in comparison with its thickness enough to warp relatively readily. When a curved second heat radiation plate 305 is pressed by a mold during the injection molding for forming a molding resin 309, the additional couplers 314 are unevenly pressed by the curved second heat radiation plate 305. However, the locally concentrated force due to the uneven pressing is cushioned by the additional couplers 314, and the semiconductor chips 301, 302 are evenly pressed by the additional couplers 314. Therefore, in the semiconductor device of FIG. 9, the additional couplers 314 prevent the semiconductor chips 301, 302 from breaking during the molding.

Other Embodiments

The bonding member anti-sticking means of FIGS. 3, 5, and 6 may be eclectically combined with each other. For example, the first coating resin film 14 shown in FIG. 3 and the flanges shown in FIG. 5 may be combined to create another semiconductor device. Alternatively, the flanges shown in FIG. 5 and the oxide layers on the side surface of the couplers 303 shown in FIG. 6 may be combined to create another semiconductor device.

In the manufacturing process of the semiconductor device shown in FIG. 3, the second coating resin film 15 is formed after each semiconductor chips 1, 2 and corresponding coupler 3, each semiconductor chips 1, 2 and the second heat radiation plate 5, and each coupler 3 and the first heat radiation plate 6 are respectively bonded with the solders 4. However, the second coating resin film 15 may be formed before the bonding steps. In that case, the second coating resin film 15 itself functions as a bonding member anti-sticking means, so even if any solder 4 spreads along the side surfaces of the couplers 3 when the couplers 3 is bonded to the semiconductor chips 1, 2 and the heat radiation plates 6, 5 with the solders 4, no solders 4 stick to the side surface of the couplers 3. Therefore, the side surfaces of the couplers 3 and the molding resin 9 are firmly connected by the second coating resin film 15 without the first coating resin film 14.

In the semiconductor devices shown in FIGS. 3, 5, and 6, the bonding member anti-sticking means is located only on the side surfaces of the couplers 3, 33, 303. However, the bonding member anti-sticking means may be formed on the side surfaces, which need to be connected to the molding resin 9, 309, of the semiconductor chips 1, 2 and the first and second heat radiation plates 6, 5.

In the semiconductor device shown in FIG. 3, the second coating resin film 15 is located on the first coating resin film 14. However, the first and second coating resin films 14, 15 are made of the same kind of resin, so the second coating resin film 15 does not necessarily need to be located on the first coating resin film 14.

In the semiconductor devices shown in FIGS. 3, 5, and 6, the solder 4, 304 are used as a bonding member. However, other materials such as silver paste may be used instead of the solders 4. Moreover, each semiconductor chips 1, 2, 301, 302 and corresponding coupler 3, 33, 303, each semiconductor chips 1, 2, 301, 302 and the second heat radiation plate 5, 305, and each coupler 3, 33, 303 and the first heat radiation plate 6, 306 are respectively bonded with bonding members that are different in type from each other.

In each semiconductor device shown in FIGS. 3, 5, and 6, the semiconductor chips 1, 2 are respectively, an IGBT chip 1, which is an insulated gate bipolar transistor, and an FWD chip 2, which is a fly-wheel diode. However, the semiconductor chips 1, 2 may be other types of semiconductor. For example, instead of the FWD chip 2, each semiconductor device in FIGS. 3, 5, and 6 may includes a MOSFET having the same function as the FWD chip 2.

The semiconductor device shown in FIG. 8 may also include additional couplers 314 to prevent the semiconductor chips 301, 302 from breaking by a curved second heat radiation plate 305 during the molding.

Figure 10:
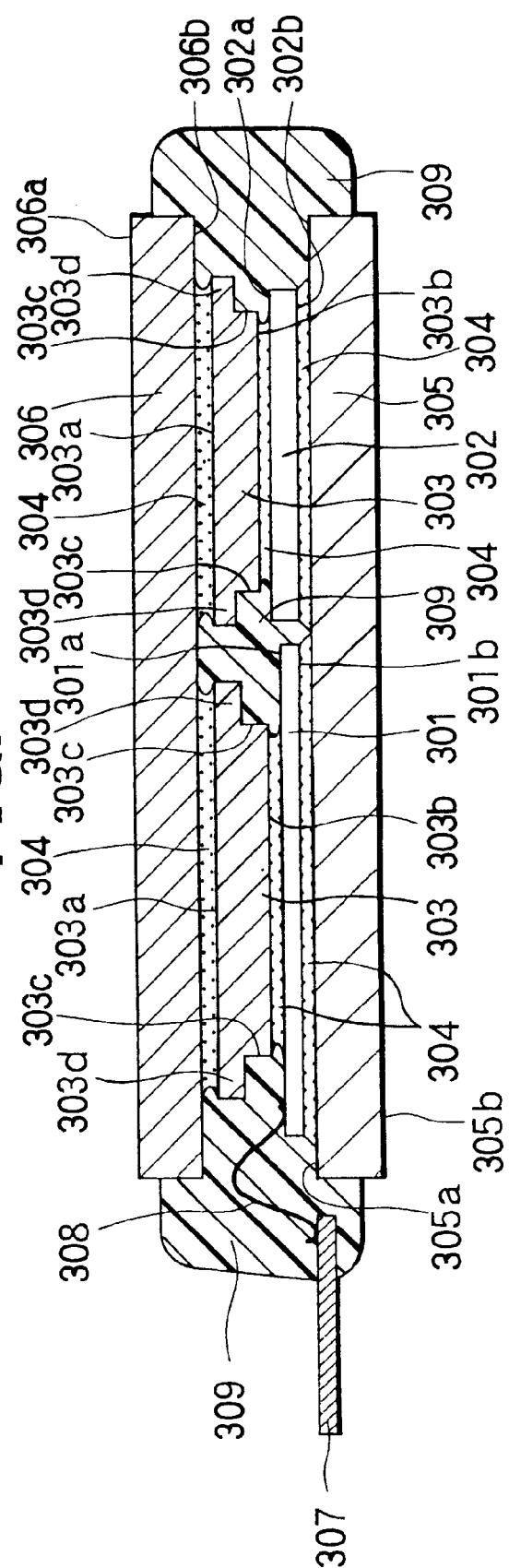
FIG. 10 is a schematic cross-sectional view of a semiconductor device according to a fifth embodiment.

In each semiconductor device shown in FIGS. 6, 8, and 9, the step 303c is located around each front surface 303a of the couplers 303, which faces the first heat radiation plate 306. However, as shown in FIG. 10, the step 303c may be located around each back surface 303b of the couplers 303, which faces corresponding semiconductor chip 301, 302. As described, the flanges 303d are less rigid than the couplers 303, and the flanges 303d can conform to the deformation of the resin 309 that is connected to the flanges 303d to decrease the stress thermally generated at the boundary between each of the semiconductor chips 301, 302 and corresponding coupler 303 when the semiconductor device experiences thermal cycles. Therefore, in the semiconductor device shown in FIG. 10 as well, the thermally generated stress is reduced by the flange 303d.

In each semiconductor device shown in FIGS. 6, 8, 9, and 10, each step 303c is located all around each coupler 303. However, the molding resin 309 starts to peel off the second radiation plate 306 at a surface of the semiconductor device. Therefore, the flanges 303d may not be located between the semiconductor chips 301, 302. The reason is that the distance from the surface of the semiconductor device to the first solder 304 along the interface between the second heat radiation plate 306 and the molding resin 309, the interface between each coupler 303 and the molding resin 309, and the interface between the flange 303d and the molding resin 309 is long enough without forming the couplers 303 between the semiconductor chips 301, 302.

What is claimed is:

1. A semiconductor device comprising:

a first conductive member;

a second conductive member;

a semiconductor chip, which is located between the conductive members;

a bonding member, which is located between the first conductive member and the semiconductor chip;

another bonding member, which is located between the second conductive member and the semiconductor chip;

a molding resin, which is located between the first and second conductive members to seal the semiconductor chip and bonding members; and a bonding member anti-sticking means, which is located between the molding resin and a surface of one member selected from the group consisting of the semiconductor chip and the conductive members, wherein the bonding member anti-sticking means has prevented the bonding members from sticking to the surface.

2. The semiconductor device in claim 1, wherein the first conductive member includes a coupler and wherein the surface is a part of the coupler.

3. The semiconductor device in claim 1, wherein the bonding member anti-sticking means is a resin film.

4. The semiconductor device in claim 1, wherein the bonding member anti-sticking means is a flange.

5. The semiconductor device in claim 1 further comprising:

another semiconductor chip, which is located between the conductive members;

another bonding member, which is located between the first conductive member and the another semiconductor chip;

another bonding member, which is located between the second conductive member and the another semiconductor chip; and another bonding member anti-sticking means, which is located between the molding resin and a surface of one member selected from the group consisting of the another semiconductor chip and the conductive members, wherein the semiconductor chips are electrically connected in parallel.

6. The semiconductor device in claim 5, wherein the first conductive member includes another coupler and wherein the surface of one member selected from the group consisting of the another semiconductor chip and the conductive members is a part of the another coupler.

7. The semiconductor device in claim 5, wherein one of the semiconductor chips is an insulated gate bipolar transistor and wherein the other of the semiconductor chips is a fly-wheel diode.

8. The semiconductor device in claim 5, wherein one of the semiconductor chips is a MOSFET.

9. A semiconductor device comprising:

a first heat radiation plate;

a second heat radiation plate;

a semiconductor chip, which is located between the first and second heat radiation plates;

a coupler, which is located between the semiconductor chip and the first heat radiation plate;

a first bonding member, which is located between the coupler and the semiconductor chip;

a second bonding member, which is located between the second heat radiation plate and the semiconductor chip;

a third bonding member, which is located between the coupler and the first heat radiation plate;

a molding resin, which is located between the first and second heat radiation plates to seal the semiconductor chip, the coupler, and the bonding members; and a coating, which is located on a surface of the coupler, wherein the coating has prevented the first and third bonding members from sticking to the surface by permitting the first and third bonding members to dewet the coating.

10. The semiconductor device in claim 9, wherein the coating is an oxide film that includes the oxide of a material making up the coupler.

11. The semiconductor device in claim 9, wherein the coating is a resin film.

12. The semiconductor device in claim 11, wherein the resin film includes one resin selected the group that consists of polyimide resin, polyamide resin, and amide resin.

13. A semiconductor device comprising:

a first heat radiation plate;

a second heat radiation plate;

a semiconductor chip, which is located between the first and second heat radiation plates;

a coupler, which is located between the semiconductor chip and the first heat radiation plate;

a first bonding member, which is located between the coupler and the semiconductor chip;

a second bonding member, which is located between the second heat radiation plate and the semiconductor chip;

a third bonding member, which is located between the coupler and the first heat radiation plate;

a molding resin, which is located between the first and second heat radiation plates to seal the semiconductor chip, the coupler, and the bonding members; and a flange, which is located on a surface of the coupler, wherein the flange has prevented the first and third bonding members from sticking to the surface.

14. The semiconductor device in claim 13 further comprising a coating, which is located on a surface of the coupler and on a surface of the flange, wherein the coating has prevented the first and third bonding members from sticking to the surfaces by permitting the first and third bonding members to dewet the coating.

15. The semiconductor device in claim 14, the coating is an oxide film that includes the oxide of a material-making up the coupler.

16. A semiconductor device comprising:

a first heat radiation plate;

a second heat radiation plate;

a semiconductor chip, which is located between the first and second heat radiation plates;

a coupler, which is located between the semiconductor chip and the first heat radiation plate;

a first bonding member, which is located between the coupler and the semiconductor chip;

a second bonding member, which is located between the second heat radiation plate and the semiconductor chip;

a third bonding member, which is located between the coupler and the first heat radiation plate;

a molding resin, which is located between the first and second heat radiation plates to seal the semiconductor chip, the coupler, and the bonding members; and a plating layer, which is located between the coupler and one of the first and third bonding members to increase the wettability of the bonding member to the coupler, wherein no plating layer is located between the molding resin and the coupler.

17. The semiconductor device in claim 16 further comprising a coating, which is located on a surface of the coupler, wherein the coating has prevented the first and third bonding members from sticking to the surface by permitting the first and third bonding members to dewet the coating.

18. The semiconductor device in claim 17, the coating is an oxide film that includes the oxide of a material making up the coupler.

19. The semiconductor device in claim 16 further comprising a flange, which is located on a surface of the coupler, wherein the flange has prevented the first and third bonding members from sticking to the surface.

20. The semiconductor device in claim 17 further comprising a flange, which is located on a surface of the coupler, wherein the flange has prevented the first and third bonding members from sticking to the surface where the flange is located.

21. A semiconductor device comprising:

a first heat radiation plate;

a second heat radiation plate;

a semiconductor chip, which is located between the first and second heat radiation plates;

a coupler, which is located between the semiconductor chip and the first heat radiation plate, wherein the coupler is electrically connected to the semiconductor chip;

a first bonding member, which is located between the coupler and the semiconductor chip;

a second bonding member, which is located between the second heat radiation plate and the semiconductor chip;

a third bonding member, which is located between the coupler and the first heat radiation plate;

a molding resin, which is located between the first and second heat radiation plates to seal the semiconductor chip, the coupler, and the bonding members; and a bonding member anti-sticking means, which is located between the molding resin and a surface of the coupler, wherein the bonding member anti-sticking means has prevented the first and third bonding members from sticking to the surface.

22. The semiconductor device in claim 21, wherein the bonding member anti-sticking means is an oxide film that includes the oxide of a material making up the coupler.

23. The semiconductor device in claim 21, wherein the bonding member anti-sticking means is a resin film.

24. The semiconductor device in claim 23, wherein the resin film includes one resin selected the group that consists of polyimide resin, polyamide resin, and amide resin.

25. The semiconductor device in claim 21, wherein the bonding member anti-sticking means is a flange, which is located on the surface.

* * * * *